United States Patent
Cox et al.

(10) Patent No.: US 8,981,760 B2
(45) Date of Patent: Mar. 17, 2015

(54) ROTATABLE DISPLAY FOR TEST AND MEASUREMENT APPARATUS

(75) Inventors: Tyler Cox, Westtown, NY (US); James Annichiarico, Hasbrouck Heights, NJ (US); Daniel Monopoli, White Plains, NY (US); Anthony Cake, Givrins (CH); Christopher K. Schroeder, San Diego, CA (US); Yann Oeffner, La Rippe (CH)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 627 days.

(21) Appl. No.: 12/941,653

(22) Filed: Nov. 8, 2010

(65) Prior Publication Data

US 2011/0115470 A1    May 19, 2011

Related U.S. Application Data

(60) Provisional application No. 61/260,930, filed on Nov. 13, 2010.

(51) Int. Cl.
  *G01R 13/34* (2006.01)
  *G01R 13/02* (2006.01)

(52) U.S. Cl.
  CPC ...................... *G01R 13/02* (2013.01)
  USPC .................. 324/121 R; 324/121 E; 324/115

(58) Field of Classification Search
  USPC ............ 324/121 R, 121 E, 76.19, 115; 702/66–76; 345/649–659; 361/679.02, 361/679.06–679.07, 679.26–679.28; 248/919
  See application file for complete search history.

(56) References Cited

U.S. PATENT DOCUMENTS

| | | | |
|---|---|---|---|
| 5,708,561 A * | 1/1998 | Huilgol et al. | 361/679.07 |
| 6,504,707 B2 * | 1/2003 | Agata et al. | 361/679.05 |
| 6,522,529 B1 * | 2/2003 | Huilgol et al. | 361/679.06 |
| 2003/0034767 A1 * | 2/2003 | Lipscomb et al. | 324/76.12 |
| 2003/0058280 A1 * | 3/2003 | Molinari et al. | 345/771 |
| 2005/0104847 A1 * | 5/2005 | Tanaka et al. | 345/156 |
| 2006/0001666 A1 * | 1/2006 | Cake et al. | 345/440 |
| 2006/0007644 A1 * | 1/2006 | Huilgol et al. | 361/681 |
| 2006/0077621 A1 * | 4/2006 | Adatia | 361/681 |
| 2006/0187626 A1 * | 8/2006 | Ditzik | 361/681 |
| 2008/0143317 A1 * | 6/2008 | Dave | 324/76.41 |
| 2009/0141045 A1 * | 6/2009 | Jackson | 345/649 |
| 2009/0258675 A1 * | 10/2009 | Okuda | 455/556.1 |
| 2010/0302278 A1 * | 12/2010 | Shaffer et al. | 345/659 |
| 2011/0134143 A1 * | 6/2011 | Ko et al. | 345/659 |
| 2011/0199076 A1 * | 8/2011 | Nagasawa | 324/207.25 |

FOREIGN PATENT DOCUMENTS

| | | | |
|---|---|---|---|
| GB | 2467134 A * | 7/2010 | |
| SE | 9900987 A * | 9/2000 | |

\* cited by examiner

*Primary Examiner* — Huy Q Phan
*Assistant Examiner* — Adam Clarke
(74) *Attorney, Agent, or Firm* — Gordon Kessler

(57) ABSTRACT

A physically rotatable display for a test and measurement apparatus is provided. The display of instrument information and data is automatically reconfigured based on the user selected orientation to provide optimal data display.

21 Claims, 4 Drawing Sheets

ROTATABLE DISPLAY FOR TEST AND MEASUREMENT APPARATUS

CROSS REFERENCE TO RELATED APPLICATIONS

This application claims the benefit of U.S. Provisional Patent Application Ser. No. 61/260,930 filed Nov. 13, 2009, titled "Rotatable Display for Test and Measurement Apparatus, the entire contents thereof being incorporated herein by reference.

FIELD OF THE INVENTION

This invention is related generally to a user configurable data display on an electronic test and measurements instrument. More particularly, the invention is related to an oscilloscope with such a display that can be physically rotated from landscape to portrait orientation.

BACKGROUND OF THE INVENTION

The debugging of electronic hardware requires a complex arrangement of test probes, cables and equipment connecting the device under test to the measurement equipment. Complex test and measurement devices, and oscilloscopes in particular, are by their very nature, multi-use instruments used for a variety of tasks. Oscilloscopes are fundamentally a tool to be able to look at a signal's voltage or current on the y-axis versus time in the x-axis.

Users may sometimes be interested in looking at a small number of signals over a longer time period. In this instance a wider display may be advantageous to allow the user to see more detail in the horizontal axis, either by viewing a longer time period, or viewing a similar time period with a greater zoom factor. Other times, users may be more interested in seeing a large number of simultaneously displayed waveforms in parallel, one above the other in the y-axis and time synchronized in order to draw conclusions about relative timing of multiple signals in complex systems. Or users may be interested in viewing the amplitude of signals in a higher resolution. In these instances, a taller display (portrait orientation) may offer inherent advantage to the user to be able to see that multitude of signals or higher resolution signals in sufficient detail. Manufacturers of oscilloscope and other test and measurement devices have traditionally hard mounted the only display of the instrument in such a way that made it impossible to offer the user the ability to select the orientation that best suits the immediate application of the user.

Therefore it would be beneficial to provide an improved apparatus that overcomes the drawbacks of the prior art.

Still other objects and advantages of the invention will in part be obvious and will in part be apparent from the specification and the drawings.

SUMMARY OF THE INVENTION

Therefore, in accordance with the invention, a test and measurement apparatus is provided including a display which can be physically rotated by the user while remaining permanently attached to the instrument to allow either more horizontal resolution (landscape) or more vertical resolution (portrait)

The display of signals may be automatically reconfigured in the display to make best use of the available resolution and screen real estate. Such reconfiguration may offer the user the ability to either have 1) more visible resolution in the time domain x-axis (landscape orientation) or 2) more visible resolution in the vertical y-axis where signal data can either be expanded or additional channels of information can be displayed in parallel to allow the user to see a large number of time synchronized signals. This additional resolution in the vertical direction may also be used to display additional information that may be of interest to a user, while maintaining display of the same or a slightly different number of synchronized signals. In a situation where an oscilloscope is provided with two displays, rotation to the vertical orientation of one of the displays may allow the information that was previously shown over two displays to be then displayed on the single display. Rotation of the two displays may also be provided.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
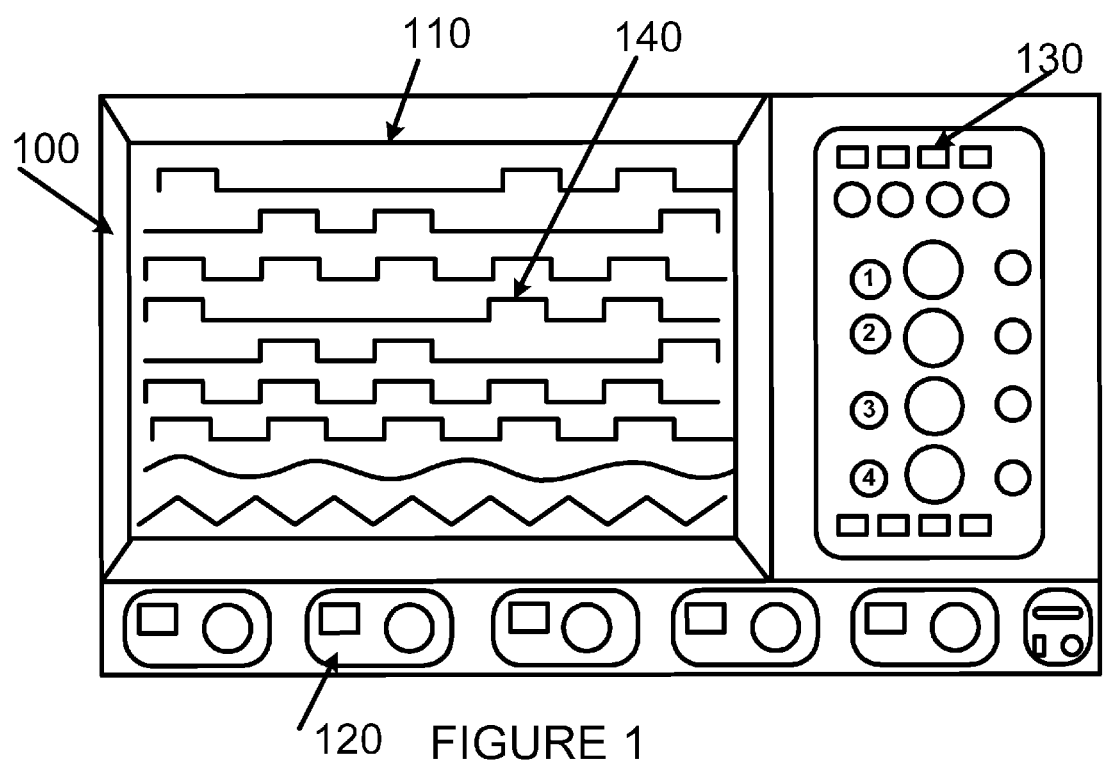
FIG. 1 depicts a representation of an oscilloscope in accordance with an embodiment of the invention in which a display is in place in a traditional landscape orientation manner.

Referring first to FIG. 1, an oscilloscope 100 is shown. While the invention is described making reference to an oscilloscope, it should be understood that the invention is intended to apply to any type of test and measurement equipment, and to any apparatus including a display and an accompanying control panel. Oscilloscope 100 is preferably provided with a display 110, input/output ports 120 and a control panel 130. User signal data 140 is also shown. In FIG. 1, display 110 is depicted in a traditional location and orientation, having more horizontal resolution than vertical resolution, thus providing a conventional oscilloscope layout. However, as will be discussed below, display 110 is in fact rotatable as constructed in accordance with an embodiment of the invention.

Figure 2:
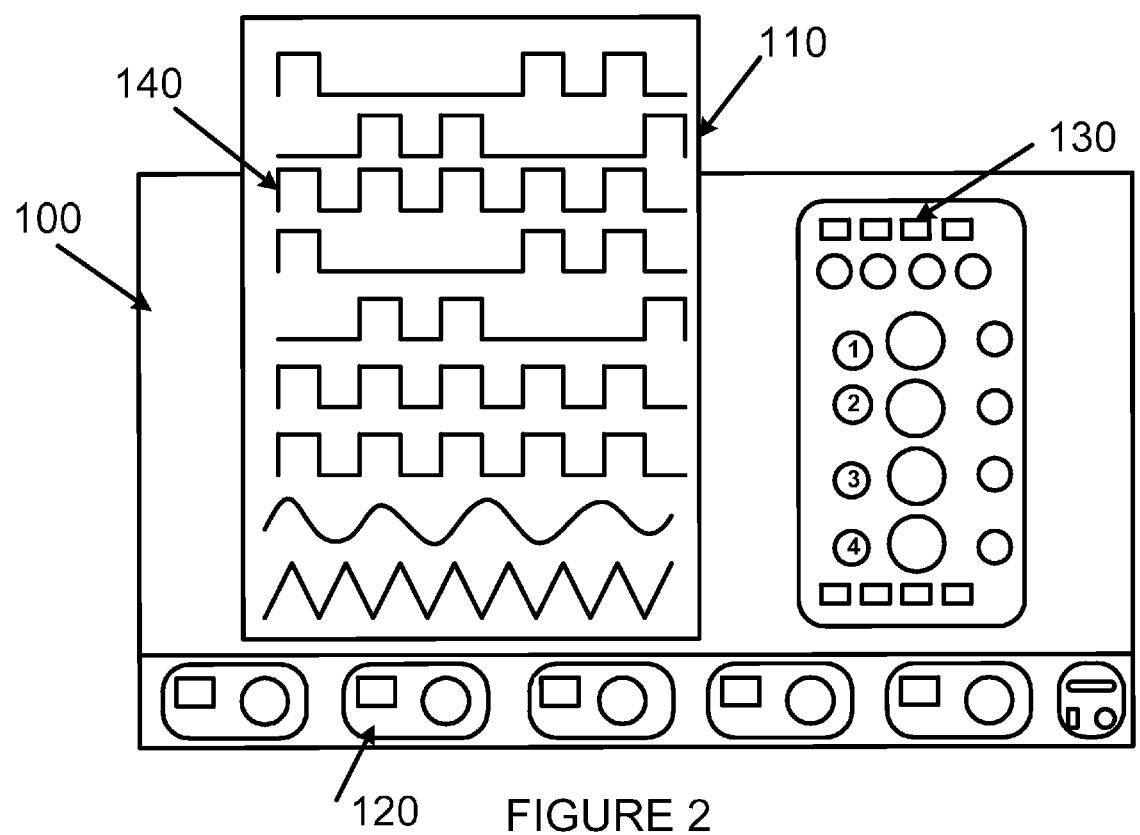
FIG. 2 depicts the oscilloscope of FIG. 1 in accordance with an embodiment of the invention with the display rotated and the display of data automatically reconfigured to make optimal use of the new display orientation.

Referring to FIG. 2, display 110 has been rotated by the user to a portrait orientation so that there is now more vertical resolution than horizontal. The display of signals on display 110 may be automatically reconfigured to make best use of the available resolution in the reconfigured display. Such reconfiguration may offer the user the ability to view more visible resolution in the vertical y-axis where signal data can either be expanded or additional channels of information can be displayed in parallel to allow the user to see a large number of time synchronized signals. This additional resolution in the vertical direction may also be used to display additional information that may be of interest to a user, while maintaining display of the same or a slightly different number of synchronized signals. This additional information may comprise various device settings, other menu choices or the like, or may comprise a soft, touch screen control panel allowing for the user to avoid using any provided hard knobs or buttons as desired.

When switching between portrait and landscape orientations of the display, the instruments application software preferably may review the number of grids displayed and may then split or combine the number of grids displayed to optimize and fill the available space. Additionally, modes that may have been defined as mutually exclusive when employing the basic horizontal grid display, such as, for example, complex editors, online help, etc may be displayed together in accordance with a split screen mode. Thus, a web editor or help may be provided on a top portion of the display while a grid display may be further provided below. Therefore, in accordance with an embodiment of the invention, an available real estate available on a display may be evaluated and compared to one or more desired display modes selected by a user, or automatically entered by the oscilloscope of other test and measurement apparatus. In accordance with this analysis, display of the desired information may particularly configured based upon available real estate. Further, it may be possible to display a large number of desired functions, one being a foreground function using a larger amount of the display, and one or more background functions, covering a smaller portion of the display. In accordance with an embodiment of the present invention, if one of the background functions encounters a situation of which the user should be notified, such function may jump to the forefront, as in a pop-up window or the like. This functionality may be enhanced in accordance with a two display system, the foreground function and one or more background functions being displayed on a first display, a number of background functions being further displayed on a second display, and wherein if any of the background functions requires notice to the user, the pop-up or other indicator may be provided on the first display, or the second display, as desired.

Furthermore, in traditional oscilloscopes, frequency domain information, including FFT or other spectrum display type information, is commonly displayed overlapped with time domain traces due to lack of adequate space to display them separately. This creates a very busy and somewhat confusing display grid which essentially combines both time domain information (magnitude versus time) and frequency domain information (magnitude versus frequency). In accordance with another advantage in accordance with embodiments of the present invention allow use of this additional vertical space in portrait mode to allow for a split of the display into a time domain view and a frequency domain view positioned vertically relative to each other, thus eliminating confusion about which axis values and markers apply to the information of interest Furthermore, the assignee of this application is also the assignee of U.S. patent application Ser. No. 12/147,787, filed Jun. 27, 2008, this application describing an oscilloscope system including two displays. In accordance with the present invention, when using such a dual display system, it is contemplated that each such display shows different information, comprising either additional display space for synchronized signals, or other diagnostic information, comprising further information views, menu choices, system administration components, or the like. In accordance with the present invention it is contemplated that upon rotation of display 110 to the vertical, second position as set forth in FIG. 2, the information originally displayed on the two displays may be displayed on the one reoriented display, resizing the information as appropriate.

Additionally, while the rotatable display has been described as being attached to the oscilloscope as shown in FIG. 2, it is contemplated in accordance with the invention that the second display, as described in the '787 application be rotatable into different orientations, and that the information originally included in the two displays be displayed on the single reoriented remote second display. This may be the case whether the second display is located adjacent to the oscilloscope and first display, or is located and operated remotely over a network, wireless system or the like. Additionally, upon rotation of one or both displays into vertical orientations, further additional information may be displayed thereon.

While any number of methods may be employed for allowing rotation of the display, preferred methods include detachment of the display, and reattachment in a reoriented position, movement forward from a housing of the oscilloscope, and then rotation about a fixed anchor axis, or simple rotation from starting location. In the final scenario, the remaining portions of the housing are preferably designed to allow clearance for such rotation for reorientation.

In an additional preferred embodiment of the invention, rotation is permitted about a movable anchor point behind the display. This preferred embodiment permits rotation in such a manner that the display and control panel are immediately adjacent in both the portrait and landscape use cases. This is important since it is an established practice to minimize the distance/time required that users must look away from the display to use the controls section. Since the display is rectangular rather than square, and since both squares and rectangles have corners that are further from their center than their edges, a simple rotation about a fixed axis would be inadequate as the corner of the display would contact into the other stationary segment of the oscilloscope, thus restricting movement, if they were to be maintained in a coplanar relationship.

This goal of adjacent display and control panel can better be accomplished if the display rotates about a non-stationary axis of rotation. In this scenario, the center of the display preferably follows a complex trajectory that maintains the lower right edge in constant contact with a stationary horizontal line on the instrument while maintaining the upper right corner in constant contact with a stationary vertical edge, preferably the control panel area). This motion thus permits the display and control panel to be perfectly adjacent in both portrait and landscape mode without crashing into each other during the rotation process.

Figure 3A:
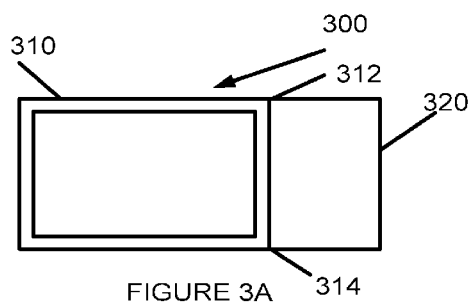
FIGS. 3A-3D depict a sequence of screen positions when moving the rotatable screen on accordance with an embodiment of the present invention.
Figure 3C:
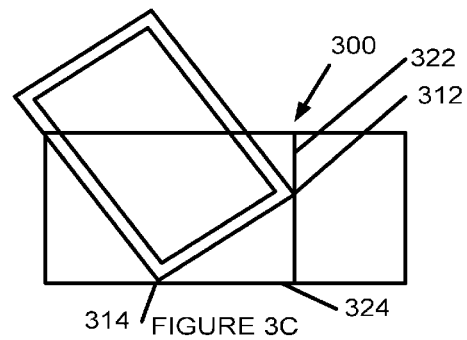

Therefore, as is shown in FIGS. 3A-3D, rotation of the display from landscape to portrait will now be described. As is shown in FIG. 3A, an oscilloscope preferably comprises a display 310, having a top right corner 312 and a bottom right corner 314. Further, oscilloscope 300 comprises a base having a control panel area 320, and is further shown in FIG. 3B, a vertical edge 322 adjacent control panel area 320, and a horizontal edge 324 following the bottom edge of display 310 when in landscape mode. While lower edge is shown at the bottom of oscilloscope 300, it should be understood that this lower edge comprises the lower edge of the display area, and that additional instrumentation, such as ports and the like as shown in FIGS. 1 and 2 may be provided below edge 324.

Figure 3B:
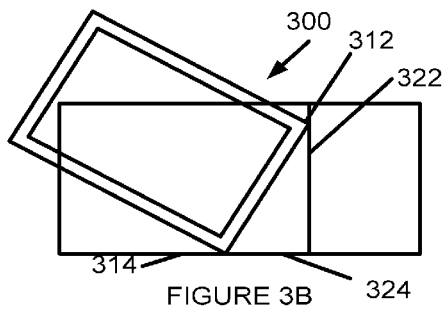
Figure 3D:
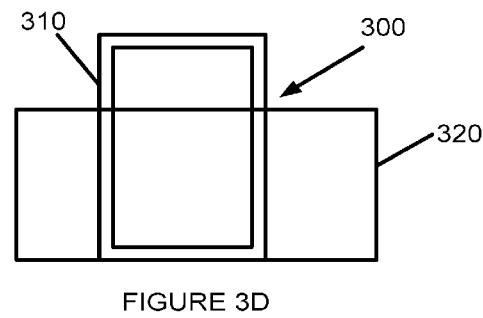

Referring to FIG. 3B, as reorientation starts, the complex movement of the anchor point behind display 310 allows, corner 312 to be maintained within edge 322, while corner 314 may be maintained within edge 324. As is further shown in FIG. 3C, a display is rotated towards portrait, vertical mode, such a positioning relationship is preferably maintained. Thus, upon reaching the vertical, portrait mode position in as is shown in FIG. 3D, display 310 is positioned adjacent control panel area 320. As is shown in the sequence of FIGS. 3A-3D, motions of display 310 may be further constrained so that corner 312 is maintained directly adjacent edge 322, while corner 314 may be maintained directly adjacent edge 324, although deviation from this precise positioning may be allowed.

Figure 4:
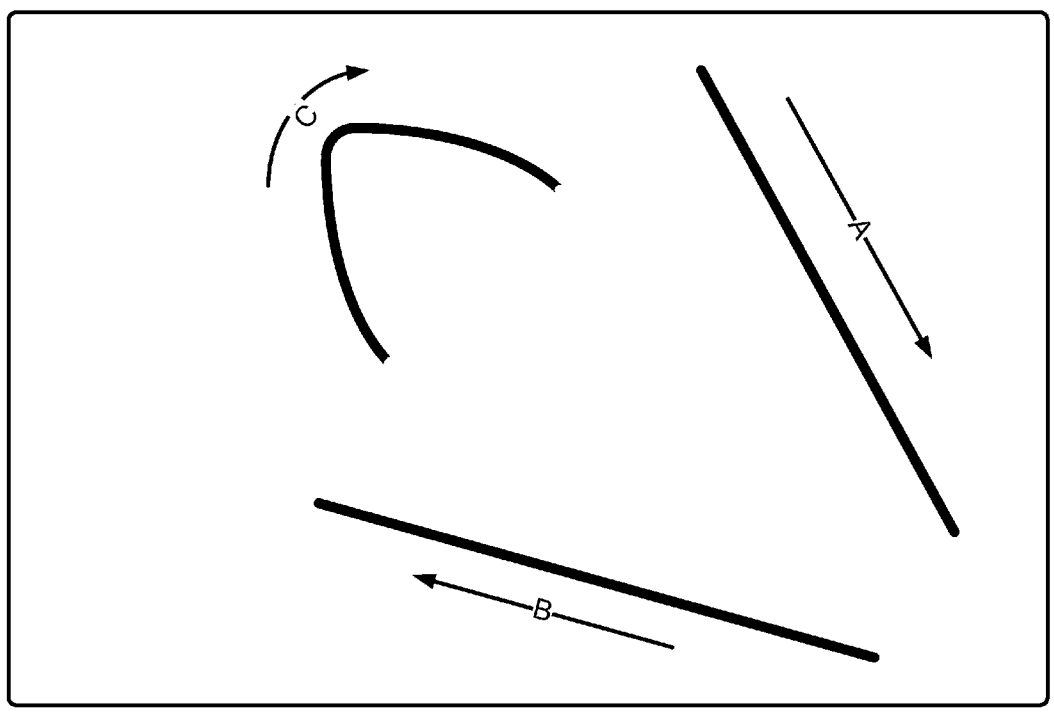

Such a complex anchor point and anchoring system is shown in FIG. 4. When in a horizontal or landscape display mode, one anchor point and two additional guide points attached to the back of the movable display are able to move through the ranges of motion indicated by the lines in FIG. 4. Thus, when moving from landscape to portrait mode, an anchor point preferably moves along a substantially parabolic path indicated in the direction of arrow C, while first and second guide points preferably move along substantially straight lines indicated by arrows A and B, respectively. When moving back from portrait to landscape mode, motion is in the opposite direction. Through these motions, the positioning of the display, and shown in FIGS. 3A-3D may be maintained.

The complex anchor point may be further configured to allow for display 310 to tilt relative to oscilloscope 300, thus providing a better viewing angle to a user regardless of the position of the display and oscilloscope. Because displays have traditionally been fixed to the oscilloscope, tilting of the display required tilting of the entire oscilloscope, with the required reconfiguration of various attached probe cables and the like, such as by using changes of support feet or the like. In addition to being unwieldy, often such tilting of the entire oscilloscope may not have been possible. Thus, by allowing for such tilting, additional flexibility is provided to the user. Such tilting may be accomplished by a standard hinge being incorporated into the anchor point, or alternatively a ball joint or the like providing a full range of motion may be employed.

While the invention has been described applicable to an oscilloscope, the invention is intended to be equally applicable to other test and measurement apparatuses and to electronic apparatuses in general.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

It is also to be understood that the following numbered paragraphs are intended to cover all of the generic and specific features of the invention herein described and all statements of the scope of the invention which, as a matter of language, might be said to fall there between.

What is claimed:

1. A test and measurement apparatus, comprising:
a display device which can be rotated from landscape to portrait orientation or back again while remaining permanently rotatably attached to the test and measurement apparatus via a first anchor point adapted to travel in a substantially parabolic path when the display is reoriented between a landscape and a portrait orientation, a first guide point that is adapted to travel in a substantially straight first line along substantially its full length of travel when the display is reoriented between the landscape and the portrait orientation, and a second guide point that is adapted to travel in a substantially straight second line along substantially its full length of travel different from the first line when the display is reoriented between the landscape and the portrait orientation, wherein upon such rotation an upper corner of the display is maintained directly adjacent to and in constant contact with a side edge defining the display area of the test and measurement apparatus when in landscape orientation and a lower corner of the display is maintained directly adjacent to and in constant contact with a lower edge defining the display area when in landscape orientation of the test and measurement apparatus.

2. The test and measurement apparatus of claim 1, wherein upon rotation of the display by user, the display of graphical information and control menus is automatically adjusted to take advantage of the new configuration for best resolution of user data.

3. The test and measurement apparatus of claim 1, wherein the test and measurement apparatus is an oscilloscope.

4. The test and measurement apparatus of claim 1, wherein upon rotation to portrait orientation, an increased space for display in the vertical direction is provided.

5. The test and measurement apparatus of claim 4, wherein additional synchronized waveforms are displayed in accordance with the increased resolution in the vertical direction.

6. The test and measurement apparatus of claim 4, wherein one or more menus are displayed in accordance with the increased resolution in the vertical direction.

7. The test and measurement apparatus of claim 4, wherein a control panel is displayed in accordance with the increased resolution in the vertical direction.

8. The test and measurement apparatus of claim 4, wherein an increased amplitude range is displayed for one or more displayed synchronized waveforms in accordance with the increased space for display in the vertical direction.

9. The test and measurement apparatus of claim 4, wherein one or more waveforms are displayed with increased visual resolution in accordance with the increased space for display in the vertical direction.

10. A test and measurement apparatus, comprising:
a display device rotatably attached to the test and measurement apparatus via a first anchor point adapted to travel in a substantially parabolic path when the display is reoriented between a landscape and a portrait orientation, a first guide point that is adapted to travel in a substantially straight first line along substantially its full length of travel when the display is reoriented between the landscape and the portrait orientation, and a second guide point that is adapted to travel in a substantially straight second line along substantially its full length of travel different from the first line when the display is reoriented between the landscape and the portrait orientation, such that when the display is reoriented between the landscape and portrait orientations, the display avoids interference with fixed portions of the test and measurement apparatus by maintaining an upper corner of the display positioned adjacent a control panel area of the test and measurement apparatus when the display is in the landscape orientation directly adjacent to and in constant contact with an edge of an area defined by the display when in the landscape orientation, and a lower corner of the display positioned adjacent the control panel area of the test and measurement apparatus when the display is in the landscape orientation is maintained directly adjacent to and in constant contact with a lower edge of an area defined by the display when in the landscape orientation.

11. The test and measurement apparatus of claim 10, wherein the test and measurement apparatus is an oscilloscope.

12. The test and measurement apparatus of claim 10, wherein the anchor point further allows for tilt of the display relative to the fixed portion of the test and measurement apparatus.

13. The test and measurement apparatus of claim 12, wherein the tilt may be provided in either landscape or portrait orientation.

14. The test and measurement apparatus of claim 10, wherein the anchor point follows a complex trajectory when the display is reoriented between landscape and portrait modes.

15. The test and measurement apparatus of claim 10, wherein when positioned in either portrait or landscape mode, the display is positioned adjacent the control panel area.

16. The test and measurement apparatus of claim 10, wherein a display of information is adjusted in accordance with an orientation of the display.

17. The test and measurement apparatus of claim 16, wherein additional waveforms are displayed when the display is positioned in the portrait orientation.

18. The test and measurement apparatus of claim 16, wherein one or more waveforms are spread out and displayed over a greater area in accordance with an orientation of the display.

19. A method for reorienting a display of a test and measurement apparatus, comprising the steps of:

rotating a display from a landscape to a portrait orientation about an anchor point adapted to travel in a substantially parabolic path when the display is reoriented from the landscape to the portrait orientation, a first guide point that is adapted to travel in a substantially straight first line along substantially its entire length of travel when the display is reoriented between the landscape and the portrait orientation, and a second guide point that is adapted to travel in a substantially straight second line along substantially its entire length of travel different from the first line when the display is reoriented between the landscape and the portrait orientation so that during reorientation, an upper corner of the display adjacent a control panel area of the test and measurement apparatus is maintained directly adjacent to a vertical line defining a side edge display area adjacent an edge of the control panel area, and a lower corner of the display starting directly adjacent the control panel area of the test and measurement apparatus is maintained directly adjacent to and in constant contact with a horizontal line defining a lower edge of the display area of the test and measurement apparatus; and modifying the display of information on the display in accordance with an orientation thereof.

20. The method of claim 19, wherein the modifying the display of information comprises displaying additional synchronized waveforms when the display is positioned in a portrait mode.

21. The method of claim 19, wherein the modifying the display of information comprises displaying one or more different functions on a split display.

* * * * *